United States Patent
Gagne-Keats

(10) Patent No.: US 10,327,308 B2
(45) Date of Patent: Jun. 18, 2019

(54) DISPLAY AND A LIGHT SENSOR OPERABLE AS AN INFRARED EMITTER AND INFRARED RECEIVER

(71) Applicant: Essential Products, Inc., Palo Alto, CA (US)

(72) Inventor: Jason Sean Gagne-Keats, Cupertino, CA (US)

(73) Assignee: ESSENTIAL PRODUCTS, INC., Palo Alto, CA (US)

( * ) Notice: Subject to any disclaimer, the term of this patent is extended or adjusted under 35 U.S.C. 154(b) by 13 days.

(21) Appl. No.: 15/838,798

(22) Filed: Dec. 12, 2017

(65) Prior Publication Data

US 2019/0082519 A1  Mar. 14, 2019

Related U.S. Application Data

(60) Provisional application No. 62/589,852, filed on Nov. 22, 2017, provisional application No. 62/558,250, filed on Sep. 13, 2017.

(51) Int. Cl.

| | |
|---|---|
| *G01J 1/44* | (2006.01) |
| *H05B 37/02* | (2006.01) |
| *G08B 13/19* | (2006.01) |
| *G01J 1/08* | (2006.01) |
| *G06F 3/042* | (2006.01) |
| *G01J 1/42* | (2006.01) |
| *G07D 7/12* | (2016.01) |
| *G01J 1/22* | (2006.01) |

(52) U.S. Cl.
CPC ............ *H05B 37/0227* (2013.01); *G01J 1/08* (2013.01); *G01J 1/22* (2013.01); *G01J 1/42* (2013.01); *G06F 3/042* (2013.01); *G07D 7/12* (2013.01); *G08B 13/19* (2013.01)

(58) Field of Classification Search
CPC ....... G06F 3/0421; H05B 37/0227; G01J 1/44
See application file for complete search history.

(56) References Cited

U.S. PATENT DOCUMENTS

| 6,650,357 B1 * | 11/2003 | Richardson ............... G01J 3/10 348/80 |
| 2015/0245767 A1 * | 9/2015 | Northcott ............. A61B 3/1216 351/206 |

* cited by examiner

*Primary Examiner* — David P Porta
*Assistant Examiner* — Fani Boosalis
(74) *Attorney, Agent, or Firm* — Perkins Coie LLP

(57) ABSTRACT

Presented here is a system to record high-resolution infrared images without the need to include additional stand-alone sensors into the mobile device. According to one embodiment, an organic light emitting diode (OLED) display is modified to emit IR and near-IR light in a large field. The modified display allows for depth sensing and infrared imaging without a stand-alone emitter. Additionally, an IR shutter filter can be applied to the existing front facing red, green, blue (RGB) camera that would only be in place when the display is in IR emission mode. The combination of these two technologies allows a facial recognition system using existing hardware, and not require additional sensors or emitters to achieve face recognition.

20 Claims, 13 Drawing Sheets

DISPLAY AND A LIGHT SENSOR OPERABLE AS AN INFRARED EMITTER AND INFRARED RECEIVER

CROSS-REFERENCE TO RELATED APPLICATIONS

This application claims priority to the U.S. Provisional Patent Application Ser. No. 62/589,852, filed Nov. 22, 2017, and to the U.S. Provisional Patent Application Ser. No. 62/558,250, filed Sep. 13, 2017, all of which are incorporated herein by this reference in their entirety.

TECHNICAL FIELD

The present application is related to a mobile device, and more specifically to methods and systems that contain a display operable as an infrared emitter, and a light sensor operable as an infrared receiver.

BACKGROUND

Current face recognition and detection systems utilizing infrared (IR) imaging, such as Google's Tango, Apple's FaceID, require an IR light source. The IR light source is a stand-alone IR emitter. Additionally, these IR systems also use a stand-alone IR receiver to receive reflected light from the IR emitter. Placing additional sensors inside a mobile device, increases the cost of manufacturing of the mobile device, and decreasing the reliability of the mobile device because foreign substances such as dirt and water can get inside the cavities drilled into the mobile device chassis. Further, the images recorded using the stand-alone IR receiver tend to be low resolution due to limited resolution of the stand-alone IR receiver.

SUMMARY

Presented here is a system to record high-resolution infrared images without the need to include additional stand-alone sensors into the mobile device. According to one embodiment, an organic light emitting diode (OLED) display is modified to emit IR and near-IR light in a large field. The modified display allows for depth sensing and infrared imaging without a stand-alone emitter. Additionally, an IR shutter filter can be applied to the existing front facing red, green, blue (RGB) camera that would only be in place when the display is in IR emission mode. The combination of these two technologies allows a facial recognition system using existing hardware, and not require additional sensors or emitters to achieve face recognition.

DETAILED DESCRIPTION

Mobile Device

Presented here is a system to record high-resolution infrared images without the need to include additional stand-alone sensors into the mobile device. According to one embodiment, an organic light emitting diode (OLED) display is modified to emit IR and near-IR light in a large field. IR spectrum spans 700 nm-1 mm wavelengths, while near-IR spectrum spans 700 nm-2500 nm wavelengths. Visible spectrum spans 380 nm-700 nm. The modified display allows for depth sensing and infrared imaging without a stand-alone emitter. Additionally, an IR shutter filter can be applied to the existing front facing red, green, blue (RGB) camera that would only be in place when the display is in IR emission mode. The combination of these two technologies allows a facial recognition system using existing hardware, and not require additional sensors or emitters to achieve face recognition.

Figure 1:
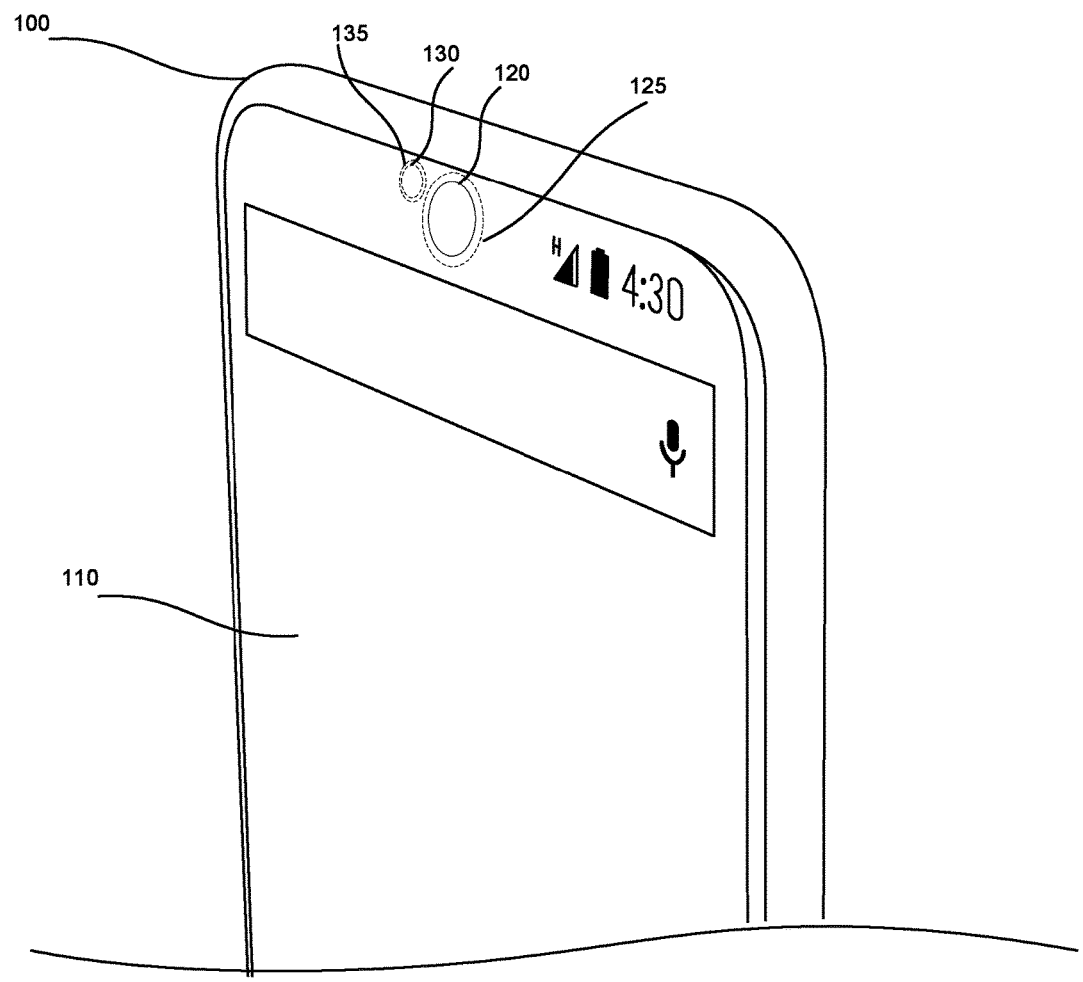
FIG. 1 shows a light sensor beneath a display.

FIG. 1 shows a light sensor beneath a display. A mobile device 100 includes the display 110, a light sensor 120 such as a camera, an optional infrared (IR) emitter 130 and a controller (not pictured), such as a processor or a microcontroller dedicated to the light sensor 120, to control a regions 125, 135 of the display 110. Region 135 is optional and can be built into the display 110 along with the optional IR emitter 130. The display 110 can be a liquid crystal display (LCD), an organic light emitting diode (OLED) display, etc.

In one embodiment the regions 125, 135 can be dual-mode regions, meaning that regions 125, 135 can change modes between being transparent and being opaque. When the region 125, 135 are opaque, they can display part of an image shown on the display screen 110. In another embodiment the regions 125, 135 can be permanently transparent, and not configured to act as a part of the display 110. Regions 125, 135 can be the same size as, or slightly larger than the light sensor 120, and the IR emitter 130, respectively. When the region 125, 135 are dual-mode regions, the dual-mode regions 125, 135 can be selectively addressable region as described in the U.S. patent application Ser. No. 15/336,380, filed Mar. Oct. 27, 2016, and incorporated by reference herein in its entirety.

The optional IR emitter 130 can emit a flash infrared light just prior to the light sensor 120 sensing the infrared light. The processor of the mobile device 100 can send an instruction to the IR emitter 130 to flash and nearly simultaneously send an instruction to the light sensor 120 to record the IR image. The IR emitter 130 can emit the flash of IR light through an opaque region 135, or the processor can send an instruction to the region 135 to turn transparent as the IR emitter 130 flashes the infrared light. The IR emitter 130 can occupy a small region of the display 110, as shown in FIG. 1, or the IR emitter 130 can be interwoven with the display 110 as described in this application.

The display 110 can be a dual-mode display transmitting both visible and IR light. The display screen 110 can include multiple display members, such as OLEDs and/or LCDs. A first mode of operation of the dual-mode display screen 110 includes multiple display members transmitting visible light and forming an image of the display screen for a viewer to see. A second mode of operation of the dual-mode display screen 110 includes multiple display members transmitting infrared (IR) light into an environment surrounding the display screen. Enabling the display 110 to transmit both visible and IR light renders the IR emitter 130 not necessary. Consequently, the IR emitter 130 can be excluded from the mobile device 100, thus minimizing the number of ports drilled into the mobile device 100, and minimizing the number of failure points of the mobile device 100.

The light sensor 120 can record a picture through the region 125 of the display 110. The light sensor 120 can record an image when the region 125 is transparent and/or when the region 125 is displaying an image. The light sensor 120 can record an infrared (IR) image and/or the light sensor 120 can record a visible light spectrum image.

The light sensor 120 can be a dual-mode light sensor, e.g. a dual-mode camera, including multiple imaging members such as a photodiode that can detect only visible light, only IR light, or both visible light and IR light. The photodiodes can be arranged to form a CMOS or a CCD sensor. A first mode of operation of the dual-mode light sensor 120 can include receiving visible light and forming an image of the visible light. A second mode of operation of the dual-mode light sensor 120 can include receiving infrared light and forming an image of the infrared light.

A controller, i.e. a processor, can synchronize the functioning of the dual-mode display screen 110 and the dual-mode light sensor 120 by sending a first instruction to the dual-mode display to transmit infrared light, and sending a second instruction to the dual-mode camera to receive infrared light. As a result, the mobile device 100 can form the IR image.

Infrared Display Screen

Figure 2A:
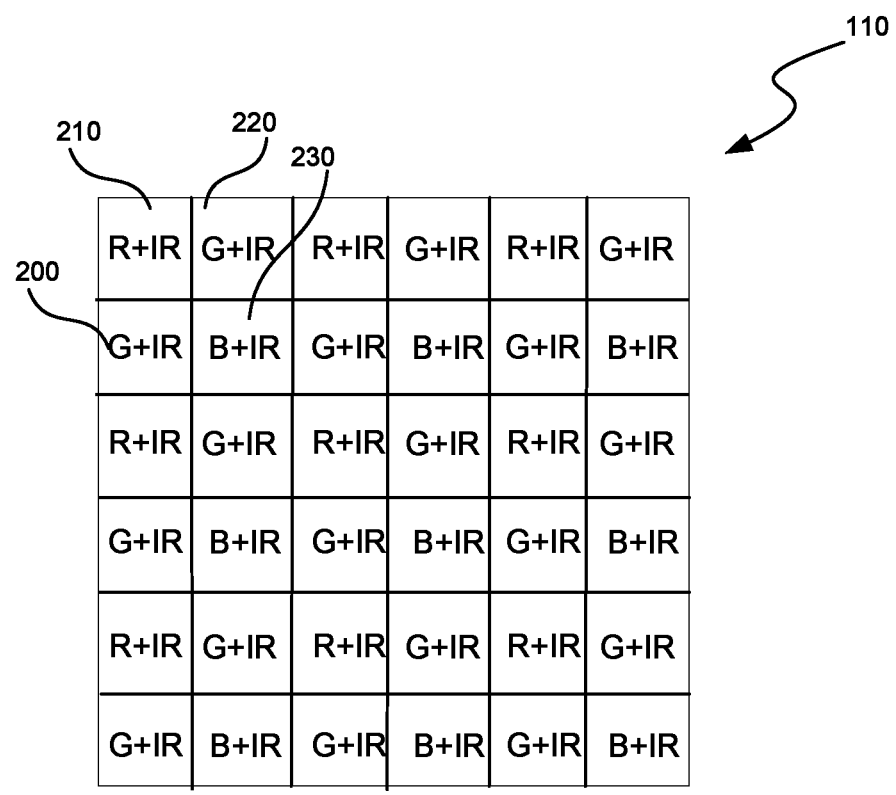
FIG. 2A shows a display screen with a dual-mode display member.

FIG. 2A shows a display screen 110 with a dual-mode display member. The display screen 110 includes a dual-mode display member 200, 210, 220, 230 (only four marked for brevity). A first mode of operation of the dual-mode display member 200, 210, 220, 230 includes transmitting visible light and forming an image on the display screen 110. A second mode of operation of the dual-mode display member 200, 210, 220, 230 includes transmitting infrared (IR) light into an environment surrounding the display screen 110.

The dual-mode display member 200, 210, 220, 230 can emit both IR light and a specific part of the visible light spectrum. For example, the dual-mode display member 210 can transmit both red light and IR light, the dual-mode display member 200, 220 can transmit both green light and IR light, while the dual-mode display member 230 can transmit both blue light and IR light. In other examples, instead of transmitting red, green, and blue light, in addition to IR light, the dual-mode display member 200, 210, 220, 230 can transmit cyan, yellow, magenta in addition to IR, cyan yellow magenta, and white in addition to IR, etc.

By default, the dual-mode display member 200, 210, 220, 230 can transmit only the visible light, or can transmit both visible light and IR light. When the default for dual-mode display member 200, 210, 220, 230 is to transmit only the visible light, a controller can send an instruction to the dual-mode display member 200, 210, 220, 230 to transmit IR light.

The dual-mode display member 200, 210, 220, 230 can be arranged in various patterns. In FIG. 2A the dual-mode display members 200, 210, 220, 230 are arranged in a square pattern tiled across the display screen 110. Alternatively, the dual-mode display members 200, 210, 220, 230 can be arranged linearly and tiled across the display screen 110, can be arranged diagonally, etc.

The dual-mode display member 200, 210, 220, 230 can include OLEDs, and/or LCDs. For example, the dual-mode display member 200, 210, 220, 230 can include OLEDs emitting green and infrared light, red and infrared light, green and infrared light, and blue and infrared light respectively. In another example, the dual-mode display member 200, 210, 220, 230 can include an LCD display stack. The LCD display stack includes: a visible light backlight to emit visible light; an infrared backlight to emit infrared light; a polarizer to adjust a polarization of the infrared light and the visible light; and a liquid crystal to selectively transmit the polarized infrared light and the polarized visible light. Further, the LCD display stack needs a filtering member such as a color filter that selectively allows red, green, blue and IR light to pass through the color filter.

Figures 2B, 2C:
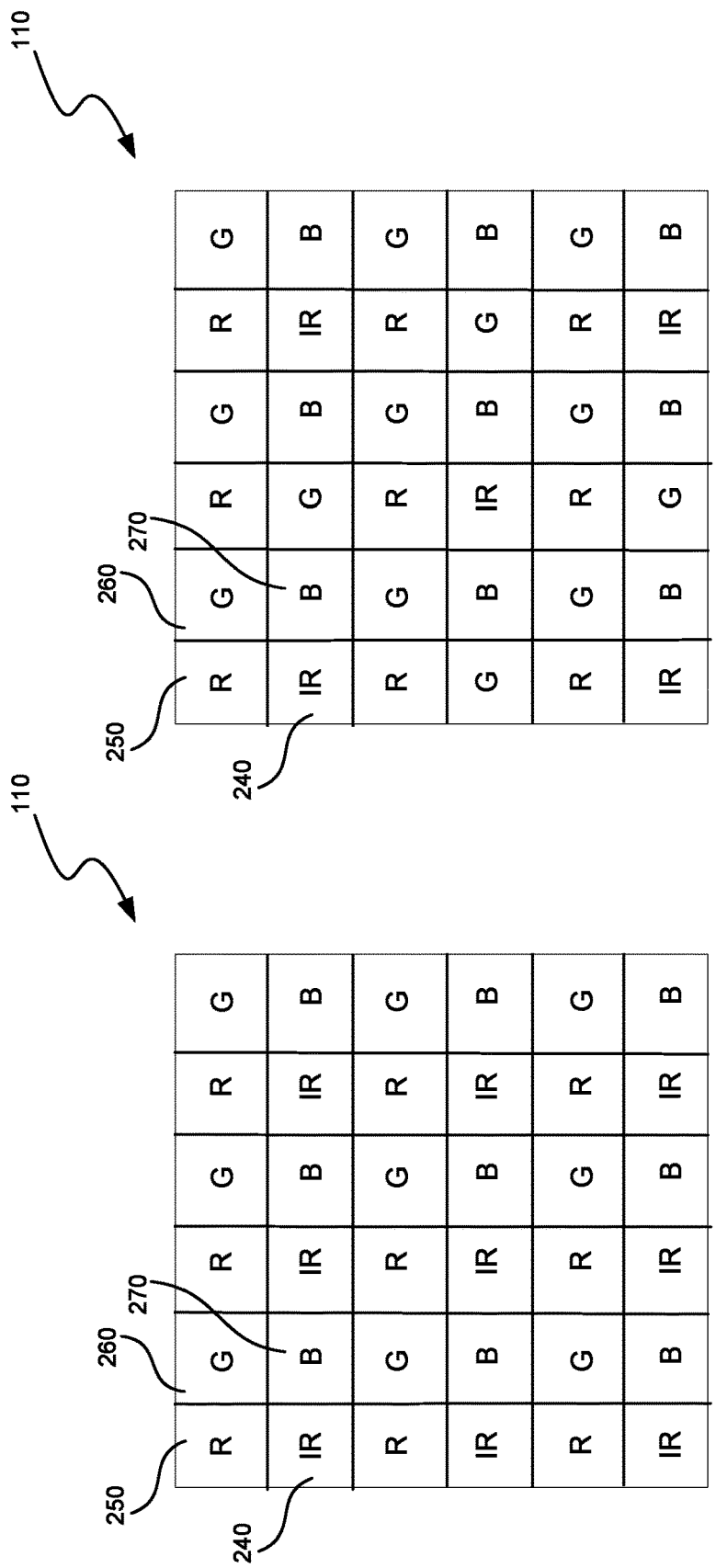
FIG. 2B-2C show a dual-mode display screen with a display member.

FIG. 2B-2C show a dual-mode display screen 110 with a display member. A first mode of operation of the dual-mode display screen 110 includes transmitting visible light and forming an image on the display screen 110. A second mode of operation of the dual-mode display screen includes transmitting infrared (IR) light into an environment surrounding the display screen 110.

The display screen 110 includes a display member 240, 250, 260, 270 (only four marked for brevity). The display member 240 can transmit IR light, display member 250 can transmit red light, display member 260 can transmit green light, and display member 270 can transmit blue light. When a controller sends an instruction to the dual-mode display screen 110 to transmit IR light, the display member 240 activates and transmits IR light.

The display members 240, 250, 260, 270 can be laid out in a regular pattern as shown in FIG. 2A-2B, or can be laid out in an irregular patent. When the display members 240, 250, 260, 270 are laid out in a regular pattern, at least one display member in the dual-mode display emits IR light.

The density of the display member 240 the transmit IR light can be the same as the density of display members 250, 260 270 transmitting visible light, as shown in FIG. 2B, or the density of the display member 240 can be different than the density of the display members 250, 260, 270 transmitting visible light. For example, in FIG. 2C, the density of the display member 240 is less than the density of the display members 250, 260, 270, because the display member 240 is repeated approximately half is often as the display members 250, 260, 270. As described in this application the display member 240, 250, 260, 270 can include an OLED or an LCD.

Figure 3:
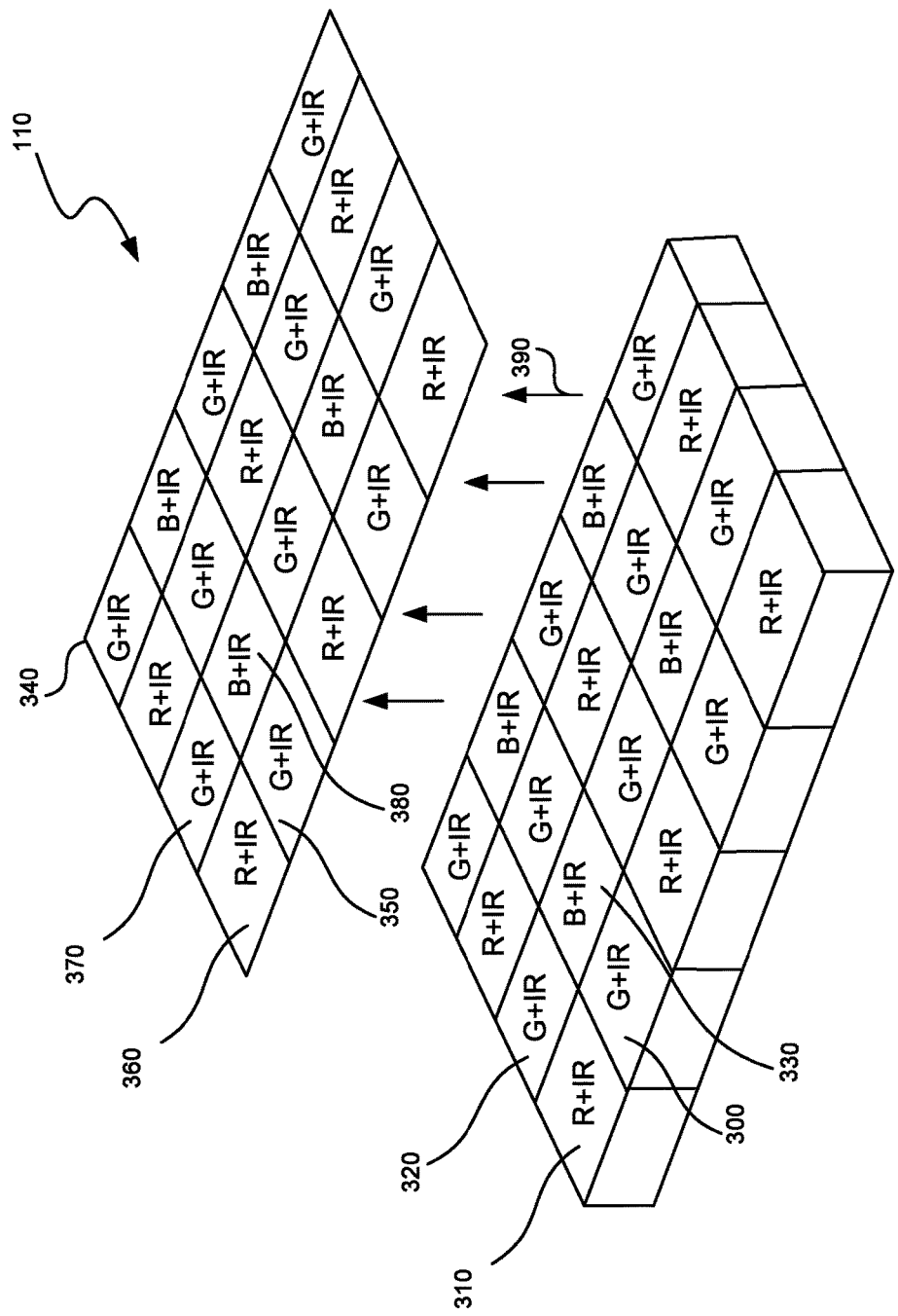
FIG. 3 shows a display member and a filtering member.

FIG. 3 shows a display member and a filtering member. Whether the display member 300, 310, 320, 330 (only four labeled for brevity) is an OLED, or an LCD, the display member 300, 310, 320, 330 can include a filtering member 340 placed on top of the display member 300, 310, 320, 330. The arrows 390 represent light transmitted by the display member 300, 310, 320, 330. The filtering member 340 can include one or more spectral filters 350, 360, 370, 380 (only four labeled for brevity) placed on top of the corresponding display member 300, 310, 320, 330, respectively. A first spectral filter 350, 370 allows only green light and IR light to pass, a second spectral filter 360 allows only red light and IR light to pass, and a third spectral filter 380 allows only blue light and IR to pass. The corresponding display member 300, 310, 320, 330 can transmit the same type of light that the spectral filter allows to pass. For example, display member 300, 320 transmits only green light and IR light, display member 310 transmits only red light and IR light, and display member 330 transmits only blue light and IR light. As described in this application, color schemes other than red green blue can be used in transmitting and filtering light, such as cyan yellow magenta, cyan yellow magenta white, red green blue white, etc.

Figure 4A:
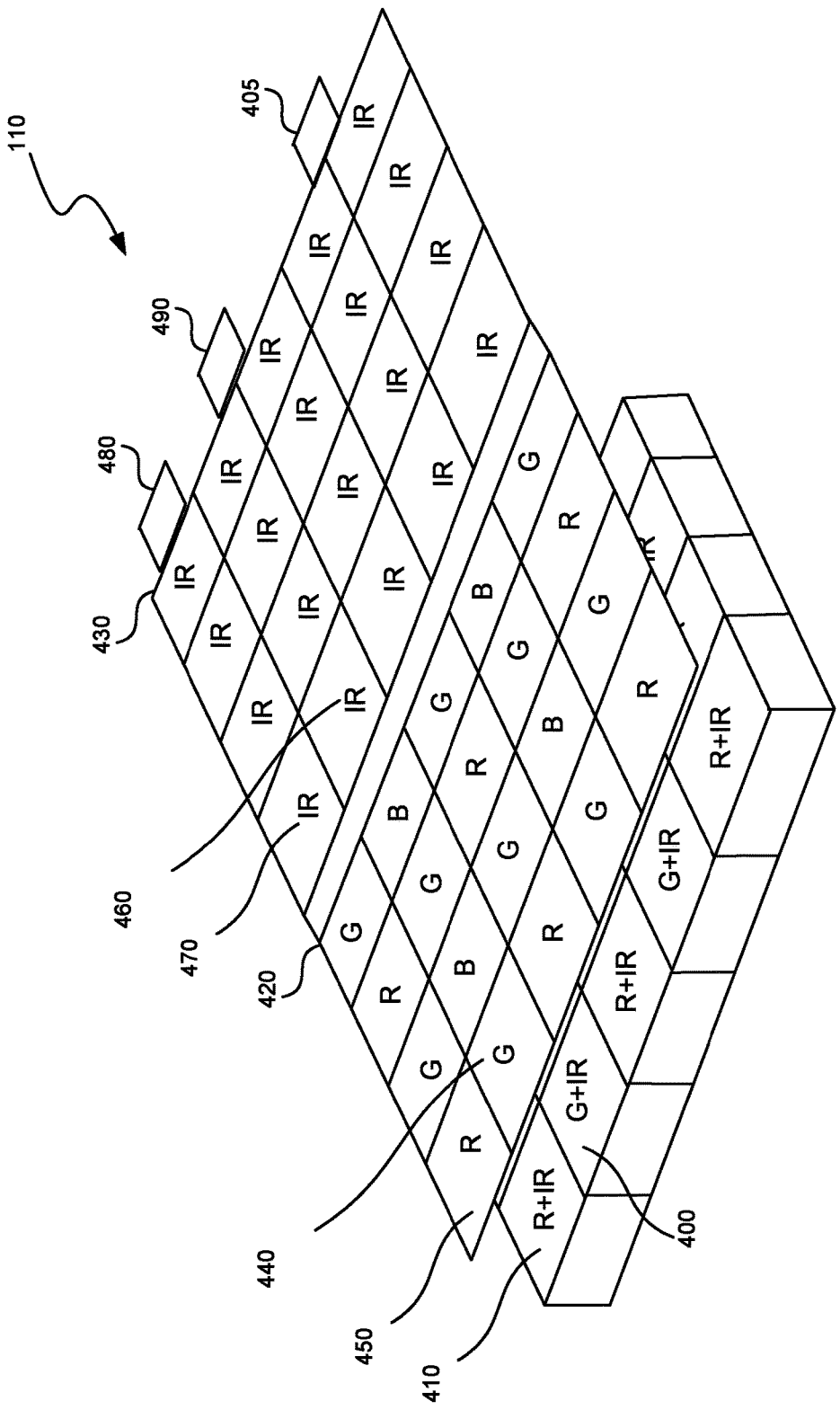
FIGS. 4A-4B show a display member, filtering member and a switching member.
Figure 4B:
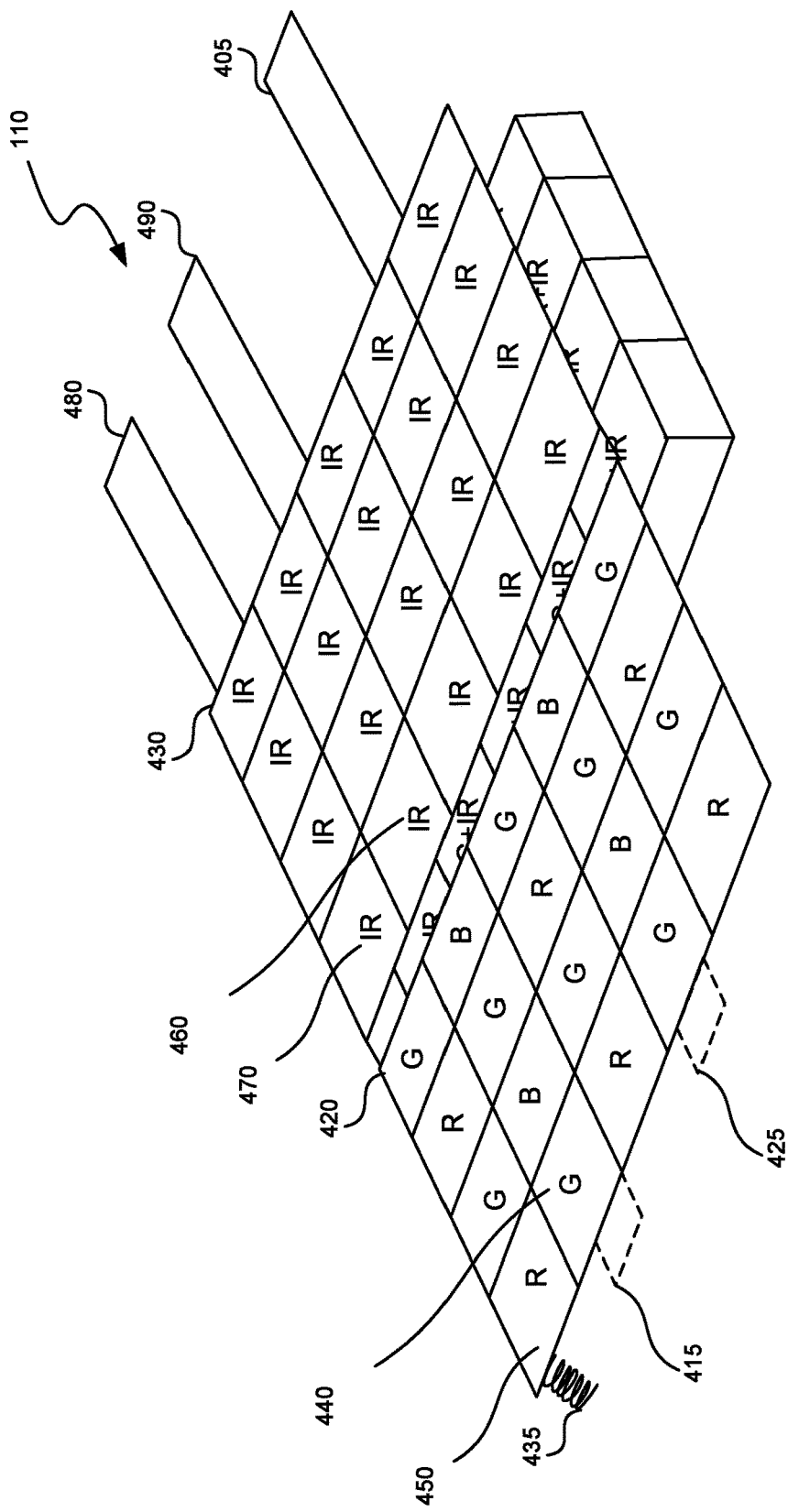

FIGS. 4A-4B show a display member, filtering member and a switching member. Display member 400, 410, (only two labeled for brevity) transmit visible light and infrared light. Specifically, display member 400 transmit green light and IR light, while display member 410 transmits red light and IR light.

Two filtering members 420, 430 can be placed over the display member 400, 410. Filtering member 420 allows visible light to pass substantially blocking all other light, while filtering member 430 allows infrared light to pass substantially blocking all other light. Spectral filters 440, 450 of the filtering member 420 can be placed above the display members 400, 410 respectively. The spectral filters 440, 450 allow visible light emitted by the display members 400, 410 to pass. For example, spectral filter 440 allows green light to pass, while spectral filter 450 allows red light to pass. The spectral filters 460, 470 of the filtering member 430 allow infrared light to pass, while substantially blocking all other wavelengths.

When the controller determines that display screen 110 should emit infrared light, the controller sends an instruction to the one or more switching members 480, 490, 405 to replace the filtering member 420 with the filtering member 430. When the filtering member 430 is placed on top of the display members 400, 410, infrared light passes through the display screen 110, while the rest of the wavelengths are substantially blocked, including the visible light transmitted by the display member 400, 410.

The switching members 480, 490, 405 can be a micro electromechanical devices (MEMS). The switching member 480, 490, 405 can include a piezo electric material which expands when power is applied to it. As shown in FIG. 4B as the piezo electric material expands, filter 420 is removed from the display member 400, 410, and filtering member 430 is positioned above the display member 400, 410 filter out visible light from the display 110. The switching members 480, 490, 405 can also include a guide along which the filtering members 420, 430 move in response to the switching members 480, 490, 405 moving the filtering members 420, 430. The guide can be a rail, and/or a groove formed in a substrate, etc.

When the controller determines that the display screen 110 should return to emitting visible light, the controller can send an instruction to the one or more switching members 480, 490, 405 to retract, thus replacing filtering member 430 with the filtering member 420. In some embodiments, one or more optional switching members 415, 425 can be placed on the opposite side of the filter is shown in FIG. 4B, which expand when switching members 480, 490, 405 retract, thus moving the filtering member 420, 430. In addition to, or instead of the optional switching members 415, 425, a MEMS spring 435 in FIG. 4B can be used to push filtering members 420, 430 that configuration shown in FIG. 4A. MEMS spring 435 can be a part of the switching member. When the MEMS spring 435 in FIG. 4B is at rest, filtering member 420 allows visible light to pass from the display member 400, 410.

In another embodiment, instead of waiting for the controller to send the instruction to place the filtering member 420 above the display member 400 410, the switching members 480, 490, 405, 415, 425, 435 can automatically place the filtering member 420 above the display member 400, 410, when recording of the IR image is completed.

Figure 5:
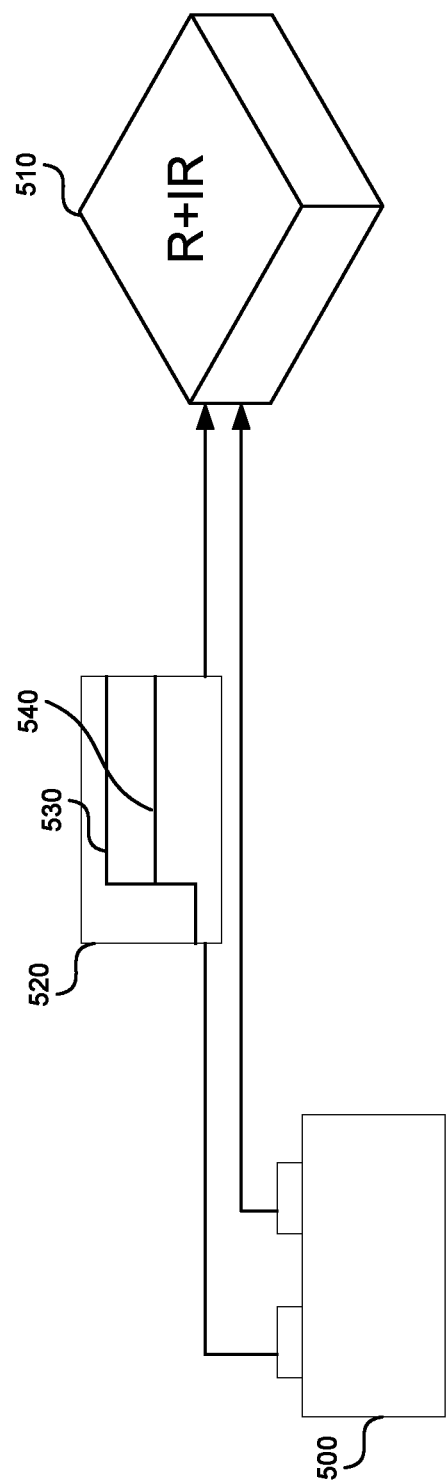
FIG. 5 shows a dual-mode display member connected to a dual-mode power source.

FIG. 5 shows a dual-mode display member connected to a dual-mode power source. The dual-mode power source 500 can be connected to the dual-mode display member 510, which transmits visible light and IR light. The dual-mode power source 500 can provide varying amounts of power 520 to the dual-mode display member 510. A first mode of operation of the dual-mode power source 500 can be to provide a first amount of power 530, causing the dual-mode display member 510 to transmit visible light. A second mode of operation of dual-mode power source 500 can be to provide a second amount of power 540, causing the dual-mode display member to transmit IR light. In some embodiments, the first amount of power 530 can be higher than the second amount of power 540. In another embodiment, the dual-mode power source 500 can provide a third amount of power to cause the dual-mode display member 500 to emit both IR and visible light at the same time. The power source 500 can be electric power source, providing varying voltage to the dual-mode display member 510. The power source 500 can be connected to a controller which can send an instruction to the dual-mode power source 500 indicating an amount of power to send to the dual-mode display member 510.

Figure 6:
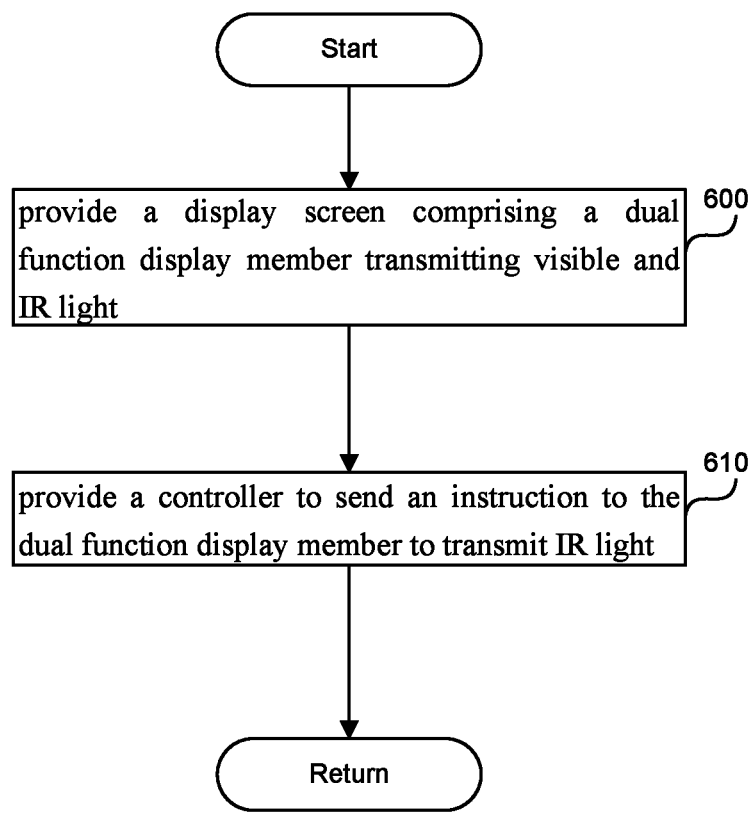
FIG. 6 is a flowchart of a method to create a display screen emitting infrared light.

FIG. 6 is a flowchart of a method to create a display screen emitting infrared light. In step 600, a display screen is provided, which includes a dual-mode display member. A first mode of operation of the dual-mode display member includes transmitting visible light and forming an image on the display screen. A second mode of operation of the dual-mode display member includes transmitting infrared (IR) light into an environment surrounding the display screen. In step 610, a controller is provided to send an instruction to the dual-mode display member to transmit IR light.

The display screen can include multiple dual-mode display members repetitively arranged, such as shown in FIGS. 2A-2C, 3, 4A-4B. The dual-mode display member can be an OLED operable to emit visible light and IR light, or an LCD stack operable to emit visible light and IR light, as described in this application. The display screen can include an OLED operable to emit only visible light and an OLED operable to emit IR light, as shown in FIGS. 2B-2C. The density of the OLED operable to emit IR light can be smaller than a density of the OLED operable to emit only visible light, as shown in FIG. 2C.

In addition, a dual-mode power source can be connected to the dual-mode display member. A first mode of operation of the dual-mode power source can be to provide a first amount of power and to cause the dual-mode display member to transmit visible light. A second mode of operation of dual-mode power source can be to provide a second amount of power and to cause the dual-mode display member to transmit IR light. The dual-mode power source can provide varying voltage. In some embodiments, the second amount of power can be lower than the first amount of power. A controller can send an instruction to the dual-mode power source to provide first, or second amount of power.

Further, a filtering member including multiple spectral filters can be provided, as shown in FIGS. 3, 4A-4B. A first spectral filter among multiple spectral filters can allow only green light and IR light to pass. A second spectral filter among multiple spectral filters can allow only red light and IR light to pass, while a third spectral can allow only blue light and IR to pass through the spectral filter. As explained in this application, or the color systems besides red green blue, can we used, such as cyan magenta yellow black, cyan magenta yellow, etc.

Infrared Light Sensor

Figure 7:
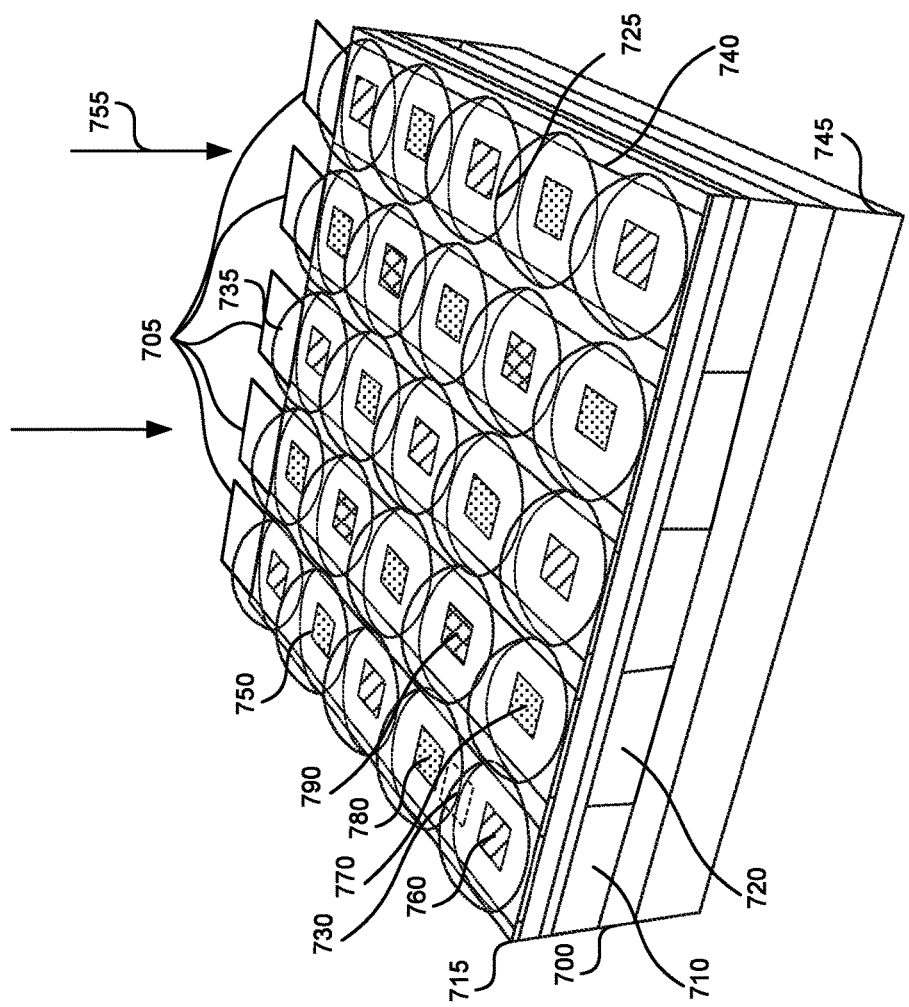
FIG. 7 shows a switching member and a light sensor.

FIG. 7 shows a switching member and a light sensor. The light sensor 700 includes multiple dual-mode imaging members 710, 720 (only two labeled for brevity), one or more filtering members 750, multiple micro lenses 725, 735 (only two labeled for brevity), an optional metal light shield 740, and substrates 715, 745. The light sensor 700 can be a camera of the mobile device 100 in FIG. 1. Substrates 745, 755 can be silicon substrates. Multiple micro lenses 725, 735 focus incoming electromagnetic waves 755 onto the multiple dual-mode imaging members 710, 720. Each micro lens 725, 735 can have a corresponding dual-mode imaging member 710, 720, respectively. The optional metal light shield 740 blocks incoming electromagnetic waves 755 from reaching the dual-mode imaging member 710, 720.

The dual-mode imaging members 710, 720 detect electromagnetic waves in a visible light spectrum and form a visible light image, as well as detecting electromagnetic waves in an IR spectrum and forming an IR image. The dual-mode imaging members 710, 720 can be wide dynamic range photodiodes, which can convert light in the range 300 nm-2500 nm or 300 nm-1 mm to electricity.

The filtering member 750 is placed between the dual-mode imaging member 710, 720 and incoming electromagnetic waves 755. The filtering member 750 can consist of a single filter, or can be divided into two or more rows of filters. The filtering member 750 includes multiple spectral filters, which include a visible light filter 760, 770, 780, 790 (only four labeled for brevity) and an IR filter 730 (only one drawn for brevity). The visible light filter 760, 770, 780, 790 substantially blocks IR light from reaching the dual-mode imaging member 710, 720, while the IR filter 730 substantially blocks visible light from reaching the dual-mode imaging member 710, 720. In FIG. 7, spectral filter 760 allows red light to pass, spectral filter 770, 780 allows green light to pass, while spectral filter 790 allows blue light to pass.

A controller can be coupled to the dual-mode imaging member 710, 720. Based on the user input, the controller can determine whether to form the visible light image or the IR image. The user input can be voice input, textual input, and/or gestural input. For example, when a phone is held at a predefined angle, such as within 45° away from vertical, the phone is locked, and the light sensor 700 detects a face, the controller can send an instruction to the display to emit IR light, and to the light sensor 700 to record IR light. Consequently, authentication of the user's face can be performed to unlock the phone. In another example, the user can give a voice command to the mobile device to record an IR image.

One or more switching member 705 move the filtering member 750 and positions the IR filter 730 between the dual-mode imaging member 710, 720 and incoming electromagnetic waves 755 when the controller determines to form the IR image. The switching member 705 can also be coupled to the controller, and receive instructions, such as an instruction to position the IR filter 730 on top of the dual-mode imaging member 710, 720. Once the IR image is recorded, the switching member 705 can automatically position the visible light filter between the dual-mode imaging member 710, 720 and incoming electromagnetic waves 755. In another example, the switching member 705 can wait to receive an instruction from the controller to position the visible light filter above the dual-mode imaging member 710, 720.

The switching member 705 can include a micro-electromechanical mechanical (MEMS) device, a nano-electromechanical device, a piezo actuator, etc. For example, the switching member 705 can include a piezo electric material which expands when power is applied to the piezo electric material. The expansion of the piezo electric material moves the filtering member 750 to position the IR filter 730 between the dual-mode imaging member 710, 720 and incoming electromagnetic waves 755 and removes the visible light filter from the dual-mode imaging member 710, 720.

The filtering member 750 can move along a guide in response to the switching member 705 moving the filtering member. The guide can be a rail, a groove in a substrate 715 on which the filtering member 750 is placed, etc.

Figure 8:
FIG. 8 shows a filtering member, according to one embodiment.

FIG. 8 shows a filtering member, according to one embodiment. The filtering member 800 can be placed above the dual-mode imaging member 710, 720 in FIG. 7. The filtering member contains alternating columns of infrared 800, 810, 820 and visible light filters 830, 840, 850. When the light sensor 700 in FIG. 1 is recording visible light, columns of visible light filters 830, 840, 850 are placed above the dual-mode imaging member 710, 720. The infrared filters 800, 810, 820 are placed underneath the metal light shield 740 in FIG. 7, for example in location of the IR filter 730 in FIG. 7. When the light sensor 700 is recording infrared light, columns of infrared filters 800, 810, 820 are placed above the dual-mode imaging member 710, 720, while the visible light filters 830, 840, 850 are hidden underneath the metal light shield 740. The visible light filter can include red, green, blue filter; red, green, blue, white filter; cyan, yellow, and a magenta filter; cyan, yellow, magenta, and white filter, etc.

The filtering member 800 can be moved left and right using one or more devices 860, 870, placed on either side of the filtering member 800, as described in this application. Devices 860, 870 can be MEMS devices, Piezo actuators, and/or springs, as described in this application. In one embodiment, the filtering member 800 can be moved to the right or left by one column, aligning the columns of infrared filters 800, 810, 820 above the dual-mode imaging member 710, 720, or aligning columns of visible light filters 830, 840, 850, respectively, as shown in FIG. 8. In another embodiment two filters, one visible light filter, one infrared filter, can be wholly moved back and forth above the dual-mode imaging member 710, 720, as shown in FIGS. 4A-4B.

Figure 9:
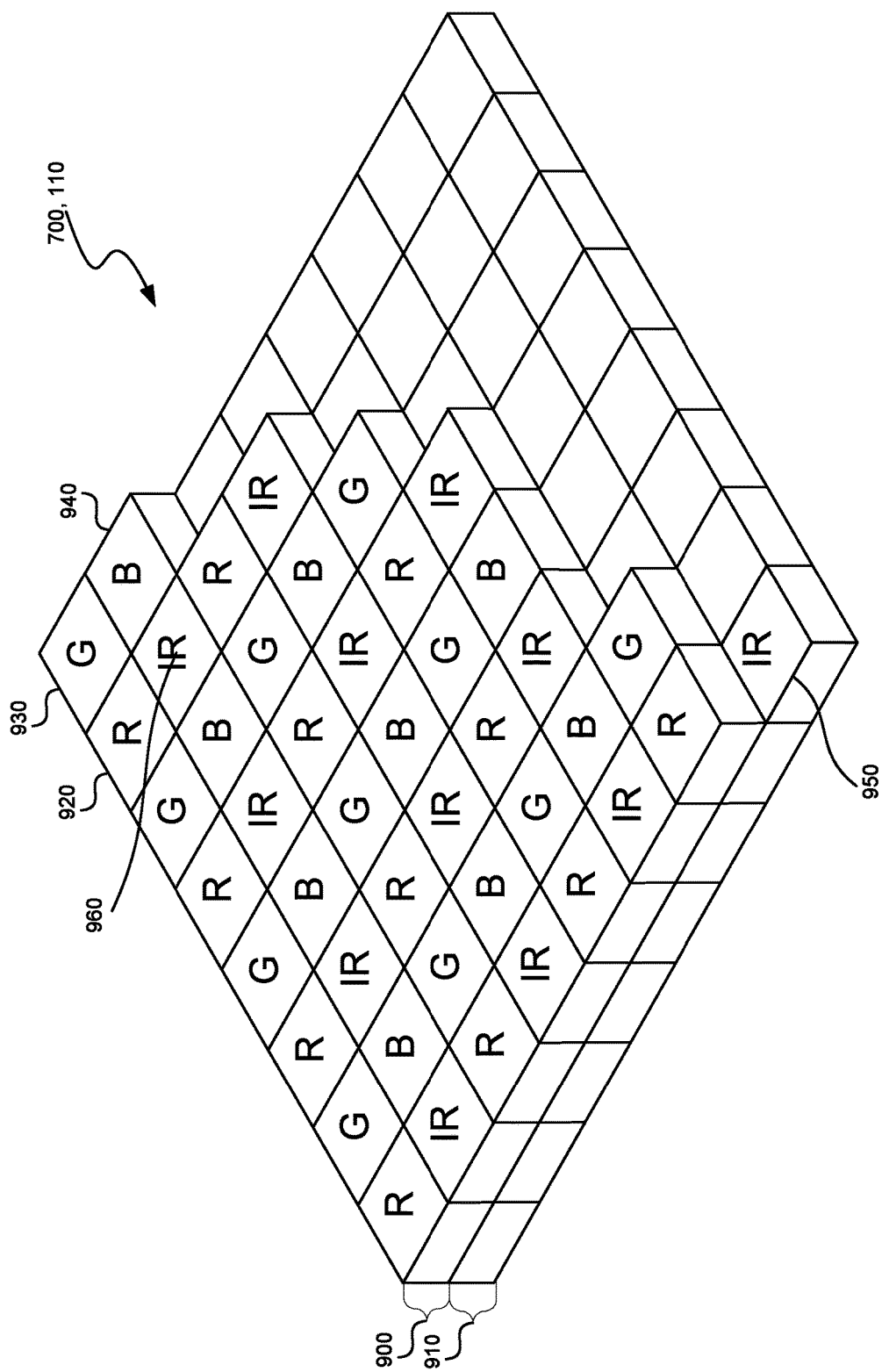
FIG. 9 shows a filtering member, according to another embodiment.

FIG. 9 shows a filtering member, according to another embodiment. The light sensor 700 in FIG. 7, 110 in FIG. 1 includes two layers: a color filter array 900, and a light sensor array 910. The color filter array 900 and the light sensor array are the same size, but have been drawn differently in FIG. 9 for the purposes of illustration. The color filter array 900 includes multiple color filters. At least one of the color filters is an infrared (IR) filter. Each filter among multiple color filters allows only light of color corresponding to the color of the filter to reach a sensor in the light sensor array 910. For example, IR filter 960 allows only infrared light to pass through it, while blocking visible light.

The light sensor array 910 includes multiple sensors. Beneath each IR filter is an IR sensor, such as IR sensor 950. Beneath each visible light filter, such as red, green, blue, is a visible light sensor. Each sensor records a scalar value representing intensity of light passing through the filter associated with the color filter array 900.

The multiple color filters associated with the color filter array 900 can include a color set such as: red, green, blue, IR; red, green, blue, emerald, IR; cyan, yellow, magenta, IR; cyan, yellow, green, magenta, IR; red, green, blue, white, IR; etc. The colors can be distributed within the color filter array 900 in a regular pattern, or an irregular pattern. The color filter array 900 shown in FIG. 9 includes a red filter 920, a green filter 930, a blue filter 940, and a IR filter 960. The color filters 920, 930, 940 in the color filter array 900 are distributed in a regular pattern, i.e., 2×2 square tiles across the color filter array 900. The shape of the color filter array 900 and the light sensor array 910 correspond to each other, and can be planar, as shown in FIG. 9, or can be curved, such that the curvature associated with the color filter array 900, and the light sensor array 910 correspond to the curvature of a sphere, an ellipsoid, a curvature of a lens associated with the imaging device, etc.

When the light sensor 700 in FIG. 7, 110 in FIG. 1 records an image, four separate grayscale images are produced. In FIG. 9 the grayscale images produced are the red image, the green image, the blue image, and the infrared image. To record the infrared image, a processor discards the red, green, and blue images, and only analyzes the infrared image recorded by the IR sensor 950. The processor can use the IR image for facial recognition since the IR image is not affected by lighting changes in the environment. The facial recognition can be used to authenticate the person logging into the phone.

Figure 10:
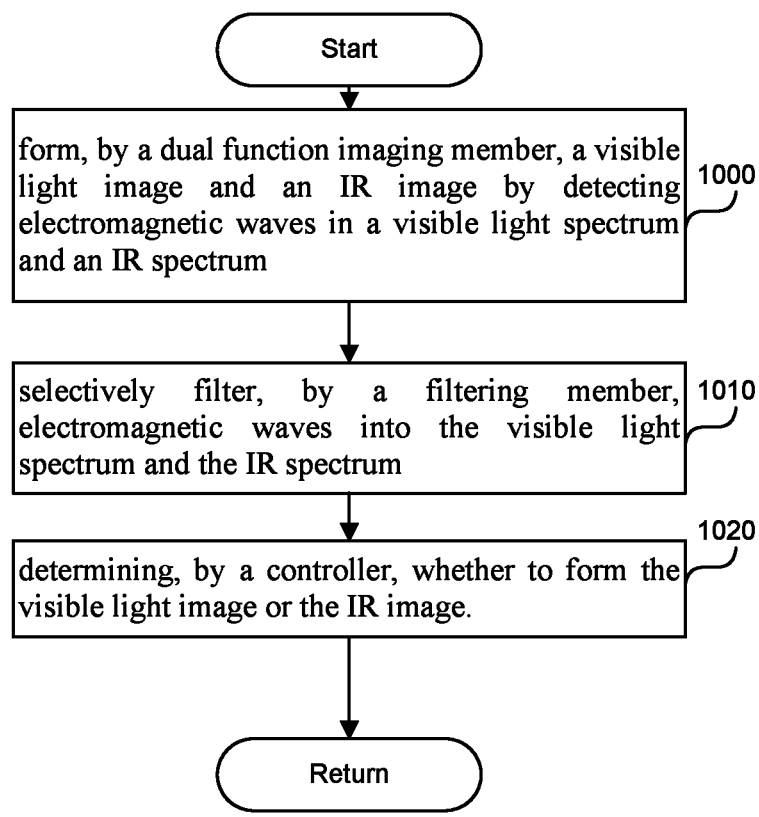
FIG. 10 is a flowchart of a method to record an infrared light image.

FIG. 10 is a flowchart of a method to record an infrared light image. In step 1000, a dual-mode imaging member forms a visible light image and an IR image by detecting electromagnetic waves in a visible light spectrum and an IR spectrum. The dual-mode imaging member can be a wide dynamic range photodiode, which can convert light in the range 300 nm-2500 nm or 300 nm-1 mm to electricity. The photodiodes can be arranged to form a CMOS or a CCD sensor.

In step 1010, a filtering member including a visible light filter and an IR filter selectively filters electromagnetic waves into the visible light spectrum and the IR spectrum. The visible light filter substantially blocks IR light from reaching the dual-mode imaging member, while the IR filter substantially blocks visible light from reaching the dual-mode imaging member.

In step 1020, the controller determines whether to form the visible light image or the IR image. This determination can be based on a user input such as textual, gestural, or voice input. For example, the user can give a voice instruction to record an infrared image, or the user can press a button on a display instructing the controller to record the infrared image. In another example, the controller can determine based on the positioning of the device 100 in FIG. 1 whether the user wants to record an IR image. More specifically, when the light sensor 700 in FIG. 1 of the device 100, detects a face, and the device 100 is positioned within 45° of vertical, the controller can determine to record an infrared image.

Before recording the infrared image, a switching member can move the filtering member and position the IR filter between the dual-mode imaging member and incoming electromagnetic waves when the controller determines to form the IR image. After the IR image is recorded, the switching member can automatically position the visible light filter between the dual-mode imaging member and the incoming electromagnetic waves, or the switching member can wait for an instruction from the controller to position the visible light filter above the dual-mode imaging member.

The filtering member can move along a guide in response to the switching member moving the filtering member. The guide can be MEMS rail, or a groove in a substrate on which the filtering member rests.

The switching member can be a MEMS device, a MEMS spring, a Piezo actuator, etc. In one embodiment, when power is provided to the switching member, the switching member expands and moves the filtering member to position the IR filter between the dual-mode imaging member and incoming electromagnetic waves. As a result, the visible light filter is positioned away from the dual-mode imaging member. In another embodiment, when power is provided to the switching member, a MEMS blocker keeping the MEMS spring compressed is removed, and the MEMS spring expands, thus moving and positioning the filtering member, as described above.

The light sensor can receive both the visible image and the IR image, and produce a grayscale image for the IR light, and for visible light, as described in this application. For example, the grayscale images produced can be the red image, the green image, the blue image, and the infrared image. To record the infrared image, a processor discards the red, green, and blue images, and only analyzes the infrared image. The controller can discard the IR image when the controller determines to form the visible light image, and discard the visible light image when the controller determines to form the IR image.

Computer

Figure 11:
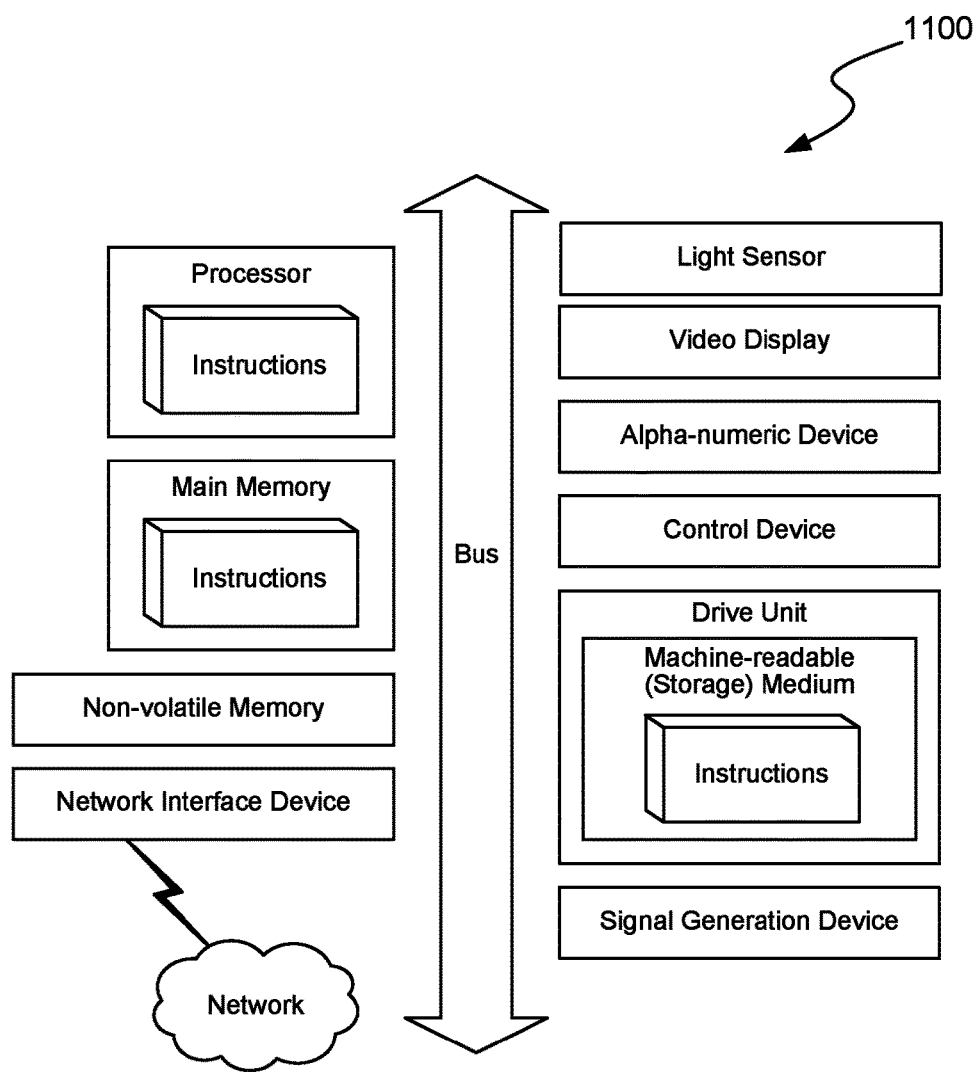
FIG. 11 is a diagrammatic representation of a machine in the example form of a computer system within which a set of instructions, for causing the machine to perform any one or more of the methodologies or modules discussed herein, may be executed.

FIG. 11 is a diagrammatic representation of a machine in the example form of a computer system 1100 within which a set of instructions, for causing the machine to perform any one or more of the methodologies or modules discussed herein, may be executed.

In the example of FIG. 11, the computer system 1100 includes a processor, memory, non-volatile memory, a light sensor, and an interface device. Various common components (e.g., cache memory) are omitted for illustrative simplicity. The computer system 1100 is intended to illustrate a hardware device on which any of the components described in the example of FIGS. 1-10 (and any other components described in this specification) can be implemented. The computer system 1100 can be of any applicable known or convenient type. The components of the computer system 1100 can be coupled together via a bus or through some other known or convenient device.

The video display of the computer system 1100 can be the display 110 in FIG. 1, and can include the IR emitter 130 in FIG. 1, and/or the IR emitter in FIGS. 2A-2C, 3, 4A-4B, 5, 7, 8, 9. The processor of the computer system 1100 can be the controller of the mobile device 100 in FIG. 1, sending instructions to the light sensor 120 in FIG. 1 to record an image, sending an instruction to the IR emitter to emit light, sending instructions to the region 125, 135 in FIG. 1 to become transparent or opaque, separating the infrared image from the visible light images recorded by the light sensor 120, analyzing the received infrared image, etc. The light sensor of the computer system 1100 can be the light sensor 120 in FIG. 1, and/or the light sensor in FIGS. 7-9.

This disclosure contemplates the computer system 1100 taking any suitable physical form. As example and not by way of limitation, computer system 1100 may be an embedded computer system, a system-on-chip (SOC), a single-board computer system (SBC) (such as, for example, a computer-on-module (COM) or system-on-module (SOM)), a desktop computer system, a laptop or notebook computer system, an interactive kiosk, a mainframe, a mesh of computer systems, a mobile telephone, a personal digital assistant (PDA), a server, or a combination of two or more of these. Where appropriate, computer system 1100 may include one or more computer systems 1100; be unitary or distributed; span multiple locations; span multiple machines; or reside in a cloud, which may include one or more cloud components in one or more networks. Where appropriate, one or more computer systems 1100 may perform without substantial spatial or temporal limitation one or more steps of one or more methods described or illustrated herein. As an example and not by way of limitation, one or more computer systems 1100 may perform in real time or in batch mode one or more steps of one or more methods described or illustrated herein. One or more computer systems 1100 may perform at different times or at different locations one or more steps of one or more methods described or illustrated herein, where appropriate.

The processor may be, for example, a conventional microprocessor such as an Intel Pentium microprocessor or Motorola power PC microprocessor. One of skill in the relevant art will recognize that the terms "machine-readable (storage) medium" or "computer-readable (storage) medium" include any type of device that is accessible by the processor.

The memory is coupled to the processor by, for example, a bus. The memory can include, by way of example but not limitation, random access memory (RAM), such as dynamic RAM (DRAM) and static RAM (SRAM). The memory can be local, remote, or distributed.

The bus also couples the processor to the non-volatile memory and drive unit. The non-volatile memory is often a magnetic floppy or hard disk, a magnetic-optical disk, an optical disk, a read-only memory (ROM), such as a CD-ROM, EPROM, or EEPROM, a magnetic or optical card, or another form of storage for large amounts of data. Some of this data is often written, by a direct memory access process, into memory during execution of software in the computer 1100. The non-volatile storage can be local, remote, or distributed. The non-volatile memory is optional because systems can be created with all applicable data available in memory. A typical computer system will usually include at least a processor, memory, and a device (e.g., a bus) coupling the memory to the processor.

Software is typically stored in the non-volatile memory and/or the drive unit. Indeed, storing and entire large program in memory may not even be possible. Nevertheless, it should be understood that for software to run, if necessary, it is moved to a computer readable location appropriate for processing, and for illustrative purposes, that location is referred to as the memory in this paper. Even when software is moved to the memory for execution, the processor will typically make use of hardware registers to store values associated with the software, and local cache that, ideally, serves to speed up execution. As used herein, a software program is assumed to be stored at any known or convenient location (from non-volatile storage to hardware registers) when the software program is referred to as "implemented in a computer-readable medium." A processor is considered to be "configured to execute a program" when at least one value associated with the program is stored in a register readable by the processor.

The bus also couples the processor to the network interface device. The interface can include one or more of a modem or network interface. It will be appreciated that a modem or network interface can be considered to be part of the computer system 1100. The interface can include an analog modem, isdn modem, cable modem, token ring interface, satellite transmission interface (e.g. "direct PC"), or other interfaces for coupling a computer system to other computer systems. The interface can include one or more input and/or output devices. The I/O devices can include, by way of example but not limitation, a keyboard, a mouse or other pointing device, disk drives, printers, a scanner, and other input and/or output devices, including a display device. The display device can include, by way of example but not limitation, a cathode ray tube (CRT), liquid crystal display (LCD), or some other applicable known or convenient display device. For simplicity, it is assumed that controllers of any devices not depicted in the example of FIG. 11 reside in the interface.

In operation, the computer system 1100 can be controlled by operating system software that includes a file management system, such as a disk operating system. One example of operating system software with associated file management system software is the family of operating systems known as Windows® from Microsoft Corporation of Redmond, Wash., and their associated file management systems. Another example of operating system software with its associated file management system software is the Linux™ operating system and its associated file management system. The file management system is typically stored in the non-volatile memory and/or drive unit and causes the processor to execute the various acts required by the operating system to input and output data and to store data in the memory, including storing files on the non-volatile memory and/or drive unit.

Some portions of the detailed description may be presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, members, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or "generating" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The algorithms and displays presented herein are not inherently related to any particular computer or other apparatus. Various general purpose systems may be used with programs in accordance with the teachings herein, or it may prove convenient to construct more specialized apparatus to perform the methods of some embodiments. The required structure for a variety of these systems will appear from the description below. In addition, the techniques are not described with reference to any particular programming language, and various embodiments may thus be implemented using a variety of programming languages.

In alternative embodiments, the machine operates as a stand-alone device or may be connected (e.g., networked) to other machines. In a networked deployment, the machine may operate in the capacity of a server or a client machine in a client-server network environment, or as a peer machine in a peer-to-peer (or distributed) network environment.

The machine may be a server computer, a client computer, a personal computer (PC), a tablet PC, a laptop computer, a set-top box (STB), a personal digital assistant (PDA), a cellular telephone, an iPhone, a Blackberry, a processor, a telephone, a web appliance, a network router, switch or bridge, or any machine capable of executing a set of instructions (sequential or otherwise) that specify actions to be taken by that machine.

While the machine-readable medium or machine-readable storage medium is shown in an exemplary embodiment to be a single medium, the term "machine-readable medium" and "machine-readable storage medium" should be taken to include a single medium or multiple media (e.g., a centralized or distributed database, and/or associated caches and servers) that store the one or more sets of instructions. The term "machine-readable medium" and "machine-readable storage medium" shall also be taken to include any medium that is capable of storing, encoding or carrying a set of instructions for execution by the machine and that cause the machine to perform any one or more of the methodologies or modules of the presently disclosed technique and innovation.

In general, the routines executed to implement the embodiments of the disclosure, may be implemented as part of an operating system or a specific application, component, program, object, module or sequence of instructions referred to as "computer programs." The computer programs typically comprise one or more instructions set at various times in various memory and storage devices in a computer, and that, when read and executed by one or more processing units or processors in a computer, cause the computer to perform operations to execute members involving the various aspects of the disclosure.

Moreover, while embodiments have been described in the context of fully functioning computers and computer systems, those skilled in the art will appreciate that the various embodiments are capable of being distributed as a program product in a variety of forms, and that the disclosure applies equally regardless of the particular type of machine or computer-readable media used to actually effect the distribution.

Further examples of machine-readable storage media, machine-readable media, or computer-readable (storage) media include but are not limited to recordable type media such as volatile and non-volatile memory devices, floppy and other removable disks, hard disk drives, optical disks (e.g., Compact Disk Read-Only Memory (CD ROMS), Digital Versatile Disks, (DVDs), etc.), among others, and transmission type media such as digital and analog communication links.

In some circumstances, operation of a memory device, such as a change in state from a binary one to a binary zero or vice-versa, for example, may comprise a transformation, such as a physical transformation. With particular types of memory devices, such a physical transformation may comprise a physical transformation of an article to a different state or thing. For example, but without limitation, for some types of memory devices, a change in state may involve an accumulation and storage of charge or a release of stored charge. Likewise, in other memory devices, a change of state may comprise a physical change or transformation in magnetic orientation or a physical change or transformation in molecular structure, such as from crystalline to amorphous or vice versa. The foregoing is not intended to be an exhaustive list in which a change in state for a binary one to a binary zero or vice-versa in a memory device may comprise a transformation, such as a physical transformation. Rather, the foregoing is intended as illustrative examples.

A storage medium typically may be non-transitory or comprise a non-transitory device. In this context, a non-transitory storage medium may include a device that is tangible, meaning that the device has a concrete physical form, although the device may change its physical state. Thus, for example, non-transitory refers to a device remaining tangible despite this change in state.

Remarks

The language used in the specification has been principally selected for readability and instructional purposes, and it may not have been selected to delineate or circumscribe the inventive subject matter. It is therefore intended that the scope of the invention be limited not by this Detailed Description, but rather by any claims that issue on an application based hereon. Accordingly, the disclosure of various embodiments is intended to be illustrative, but not limiting, of the scope of the embodiments, which is set forth in the following claims.

The invention claimed is:

1. A light sensor comprising:
a dual-mode imaging member that detects electromagnetic waves in a visible light spectrum and forms a visible light image, and that detects electromagnetic waves in an IR spectrum and forms an IR image;
a filtering member disposed between the dual-mode imaging member and incoming electromagnetic waves, the filtering member comprising a plurality of spectral filters comprising a visible light filter and an IR filter, the visible light filter in the plurality of visible light filters, when disposed between the imaging member and the incoming electromagnetic waves, substantially blocking IR light from reaching the dual-mode imaging member, and the IR filter in the plurality of spectral filters, when disposed between the imaging member and the incoming electromagnetic waves, substantially blocking visible light from reaching the dual-mode imaging member;
a switching member that moves the filtering member to dispose the IR filter between the dual-mode imaging member and the incoming electromagnetic waves; and
a controller that sends instructions to the dual-mode imaging member and the switching member to form the IR image.

2. The light sensor of claim 1, comprising the IR filter and the visible light filter alternating placement in the plurality of spectral filters.

3. The light sensor of claim 1, comprising a guide along which the filtering member moves in response to the switching member moving the filtering member.

4. A system comprising:
a dual-mode imaging member that detects electromagnetic waves in a visible light spectrum and forms a visible light image, and that detects electromagnetic waves in an IR spectrum and forms an IR image;

a filtering member disposed between the dual-mode imaging member and incoming electromagnetic waves, the filtering member comprising a plurality of spectral filters comprising a visible light filter and an IR filter, the visible light filter in the plurality of visible light filters, when disposed between the imaging member and the incoming electromagnetic waves, substantially blocking IR light from reaching the dual-mode imaging member, and the IR filter in the plurality of spectral filters, when disposed between the imaging member and the incoming electromagnetic waves, substantially blocking visible light from reaching the dual-mode imaging member; and a controller coupled to the dual-mode imaging member, the controller determining whether to form the visible light image or the IR image.

5. The system of claim 4, comprising:
a switching member that moves the filtering member to dispose the IR filter between the dual-mode imaging member and the incoming electromagnetic waves when the controller determines to form the IR image.

6. The system of claim 5, the switching member the positions the visible light filter between the dual-mode imaging member and the incoming electromagnetic waves upon forming the IR image.

7. The system of claim 5, comprising a guide along which the filtering member moves in response to the switching member moving the filtering member.

8. The system of claim 5, the switching member comprising a micro-electromechanical mechanical (MEMS) device, or a Piezo actuator.

9. The system of claim 5, the switching member comprising a piezo electric material that expands when power is applied to the Piezo electric material thereby moving the filtering member to position the IR filter between the dual-mode imaging member and the incoming electromagnetic waves and removing the visible light filter from the dual-mode imaging member.

10. The system of claim 4, the filtering member comprising the IR filter and the visible light filter repeated in a pattern.

11. The system of claim 4, the visible light filter comprising a red filter, a green filter, and a blue filter.

12. The system of claim 4, the controller that receives both the visible light image and the IR image, that discards the IR image when the controller determines to form the visible light image, and that discards the visible light image when the controller determines to form the IR image.

13. The system of claim 4, the dual-mode imaging member comprising a wide dynamic range photodiode.

14. The system of claim 4, comprising an infrared emitter.

15. A method comprising:
forming, by a dual-mode imaging member, a visible light image and an IR image by detecting electromagnetic waves in a visible light spectrum and an IR spectrum;
selectively filtering, by a filtering member comprising a visible light filter and an IR filter, electromagnetic waves into the visible light spectrum and the IR spectrum by the visible light filter substantially blocking IR light from reaching the dual-mode imaging member, and the IR filter substantially blocking visible light from reaching the dual-mode imaging member; and
determining, by a controller, whether to form the visible light image or the IR image.

16. The method of claim 15, comprising:
moving, by a switching member, the filtering member and positioning the IR filter between the dual-mode imaging member and incoming electromagnetic waves when the controller determines to form the IR image.

17. The method of claim 16, comprising:
positioning, by the switching member, the visible light filter between the dual-mode imaging member and the incoming electromagnetic waves upon forming the IR image.

18. The method of claim 16, comprising:
moving the filtering member along a guide in response to the switching member moving the filtering member.

19. The method of claim 16, comprising:
providing power to the switching member;
in response to the provided power, expanding the switching member thereby moving the filtering member to position the IR filter between the dual-mode imaging member and the incoming electromagnetic waves and moving the visible light filter away from the dual-mode imaging member.

20. The method of claim 15, comprising:
receiving, by the controller, both the visible light image and the IR image, discarding the IR image when the controller determines to form the visible light image, and discarding the visible light image when the controller determines to form the IR image.

* * * * *